United States Patent
Wilkerson et al.

(10) Patent No.: US 9,583,182 B1
(45) Date of Patent: Feb. 28, 2017

(54) MULTI-LEVEL MEMORY MANAGEMENT

(71) Applicant: Intel Corporation, Santa Clara, CA (US)

(72) Inventors: Christopher B. Wilkerson, Portland, OR (US); Alaa R. Alameldeen, Hillsboro, OR (US); Zhe Wang, Hillsboro, OR (US); Zeshan A. Chishti, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/077,424

(22) Filed: Mar. 22, 2016

(51) Int. Cl.
    *G11C 16/04* (2006.01)
    *G11C 11/56* (2006.01)

(52) U.S. Cl.
    CPC .................. *G11C 11/5628* (2013.01)

(58) Field of Classification Search
    CPC ..... G11C 16/10; G11C 11/56; G11C 11/5621; G11C 16/0483; G11C 11/5628

USPC .......................................... 365/185.03, 185.12
See application file for complete search history.

(56) References Cited

U.S. PATENT DOCUMENTS

| | | | | |
|---|---|---|---|---|
| 6,208,542 B1* | 3/2001 | Wang | ..................... | G11C 5/145 365/189.03 |
| 2015/0179269 A1* | 6/2015 | Lee | ........................ | G11C 16/14 365/185.03 |

* cited by examiner

*Primary Examiner* — Huan Hoang
(74) *Attorney, Agent, or Firm* — Compass IP Law

(57) ABSTRACT

A multi-level memory management circuit can remap data between near and far memory. In one embodiment, a register array stores near memory addresses and far memory addresses mapped to the near memory addresses. The number of entries in the register array is less than the number of pages in near memory. Remapping logic determines that a far memory address of the requested data is absent from the register array and selects an available near memory address from the register array. Remapping logic also initiates writing of the requested data at the far memory address to the selected near memory address. Remapping logic further writes the far memory address to an entry of the register array corresponding to the selected near memory address.

21 Claims, 8 Drawing Sheets

MULTI-LEVEL MEMORY MANAGEMENT

FIELD

Embodiments of the invention are generally related to memory devices, and more particularly to management of multi-level memory such as near and far memory.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2016, Intel Corporation, All Rights Reserved.

BACKGROUND

Memory devices are ubiquitous in computing devices to store data and code for a processor to execute operations and accomplish the functioning of computing devices. There is a trend in memory systems to move from a flat memory space with uniform performance characteristics to more heterogeneous memory systems, which may also be referred to as multi-level memory systems. An example of a multi-level memory system is a system that includes a faster memory and a slower memory coupled to the same processor. In such multi-level memory systems, the ratio of accesses to the faster memory versus to the slower memory can impact system performance.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
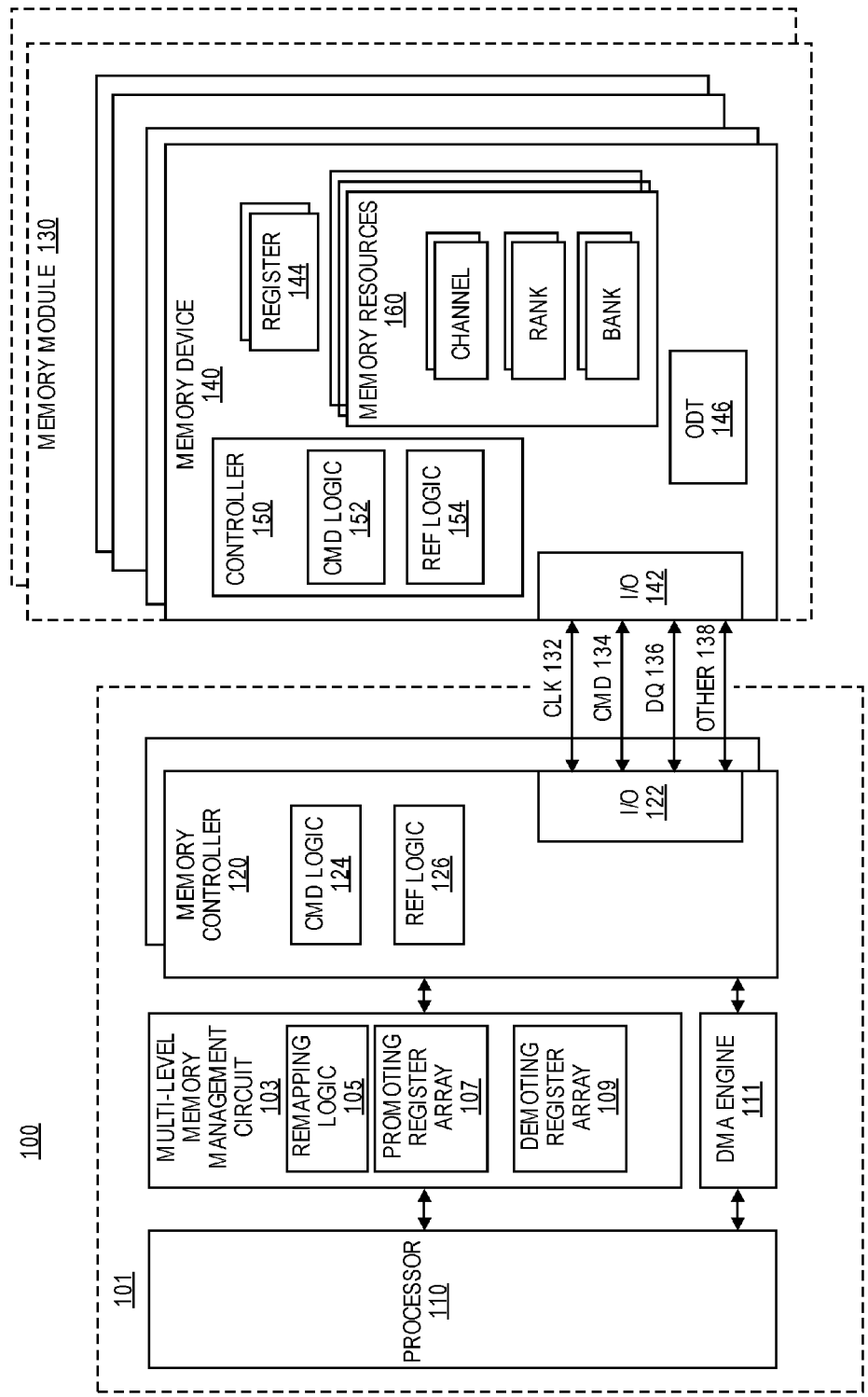
FIG. 1 is a block diagram of an embodiment of a system that includes a multi-level memory management circuit.

Descriptions of certain details and implementations follow, including a description of the figures, which may depict some or all of the embodiments described below, as well as discuss other potential embodiments or implementations of the inventive concepts presented herein.

DETAILED DESCRIPTION

As mentioned briefly above, computing systems can include multiple types of main memory, such as a memory that is faster and a memory that is slower. For example, in one embodiment, a system includes both "near memory" and "far memory." Near memory and far memory are memories with different characteristics, such as different operating characteristics. In one embodiment, near memory is memory that is faster than far memory. For example, near memory can have high bandwidth and/or low latency. In comparison to near memory, far memory can have lower bandwidth and/or higher latency. Near memory can be, but is not necessarily, disposed physically closer to a processor than far memory. Additionally, near memory can be, but is not necessarily, "local memory," and far memory can be "non-local memory." In a system with multiple processors, local memory is a region of memory assigned to one of the processors. Non-local memory is a region of memory assigned to another of the processors. Near memory and far memory can also (or alternatively) be referred to as different "levels" of memory, and thus a system with both near and far memory can be an example of a "multi-level memory system." Systems with both near and far memory may also be referred to as "heterogeneous memory systems."

Including multiple levels of memory can improve overall system performance. For example, including a near memory region can be beneficial due to the near memory's low latency and/or high bandwidth. However, cost or limited real estate near the processor can limit the size of near memory. Therefore, system performance can often be improved by including a far memory region that has a higher latency and/or lower bandwidth than the near memory, but which can be less expensive and located further from the processor. For example, stacked DRAM can provide a region of near memory, and traditional DRAM or other memory technologies that have lower performance can provide a region of far memory. However, it is to be understood that near memory and far memory are not limited to any particular memory technology. Rather, a near memory region is defined based on its characteristics relative to a far memory region, as explained above.

Multi-socket systems can also include multi-level memory. For example, a multi-socket system can couple each socket with its own local memory. In one such example, the memory that is mapped to a given socket is near memory, and the memory that is mapped to other sockets is far memory. Such multi-socket systems can implement a type of memory organization referred to as non-uniform memory access (NUMA). NUMA can reduce memory latency when cores access their socket's local memory (e.g., near memory), but increase memory latency when accessing memory regions mapped to other sockets (e.g., far memory). Thus, in multi-level memory systems, maximizing the number of references to near memory and minimizing references to far memory can improve system performance. Accordingly, managing multi-level memory so that frequently or recently accessed data is found in near memory can have a positive impact on system performance.

As described herein, in one embodiment, a multi-level memory management circuit can remap addresses between near and far memory without requiring significant remapping structures. A multi-level memory management circuit can include a register array to store near memory addresses and far memory addresses that are mapped to the near memory addresses. In one embodiment, the number of entries in the register array is less than and independent of the size of near memory, and can be selected based on desired performance characteristics.

In one embodiment, the multi-level memory management circuit includes remapping logic, which, upon detecting a request for data located in far memory, checks the register array to see if the far memory address is already in the register array. If the far memory address is in the register array, the data is in near memory at a location indicated by the register array. If the far memory address is not in the register array, the remapping logic selects an available memory address and causes the requested data to be copied from far memory to near memory at the selected near memory address. The remapping logic can then update the register array to reflect the mapping.

In the event that there are no available near memory addresses left in the register array, in one embodiment, the remapping logic triggers an interrupt to cause the OS to update the register array. The OS can update page tables based on the register array during the interrupt handling, and update the register array with available near memory addresses. In one embodiment, interrupt handling occurs after the remapping logic remaps multiple pages, amortizing the costs the OS incurs over multiple pages instead of just one page.

FIG. 1 is a block diagram of an embodiment of a system that includes a multi-level memory management circuit. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single and/or a multicore processing unit. The processing unit can be a primary processor such as a CPU (central processing unit) and/or a peripheral processor such as a GPU (graphics processing unit). System 100 can be implemented as a system on a chip (SOC) 101, or be implemented with standalone components.

Memory controller 120 represents one or more memory controller circuits or devices for system 100. Memory controller 120 represents control logic that generates memory access commands in response to the execution of operations by processor 110. If a something (e.g., "x") occurs in response to another event (e.g., "y"), x can be directly or indirectly in response to y. For example, the occurrence of y can eventually result in the occurrence of x, but there may be other intermediate events and/or conditions. In other scenarios, y may not necessarily result in the occurrence of x, and x may occur even though y has not occurred. Furthermore, "in response to" does not exclude the existence of additional and/or different causative events. Thus, the term "in response to" can also mean "at least partially in response to." Memory controller 120 accesses one or more memory devices 140. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. In one embodiment, settings for each channel are controlled by separate mode registers or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a system bus. I/O interface logic 122 (as well as I/O interface logic 142 of memory device 140) can include pins, connectors, signal lines, and/or other hardware to connect the devices. I/O interface logic 122 can include a hardware interface. Typically, wires within an integrated circuit couple with a pad or connector to interface signal lines or traces between devices. I/O interface logic 122 can include drivers, receivers, transceivers, termination, and/or other circuitry to send and/or receive signal on the signal lines between the devices. The system bus can be implemented as multiple signal lines coupling memory controller 120 to memory devices 140. The system bus includes at least clock (CLK) 132, command/address (CMD) and write data (DQ) 134, read DQ 136, and zero or more other signal lines 138. In one embodiment, a bus or connection between memory controller 120 and memory can be referred to as a memory bus. The signal lines for CMD 134 can be referred to as a "C/A bus" (or ADD/CMD bus, or some other designation indicating the transfer of commands and address information). The signal lines for write and read DQ 136 can be referred to as a "data bus." In one embodiment, independent channels have different clock signals, C/A buses, data buses, and other signal lines. Thus, system 100 can be considered to have multiple "system buses," in the sense that an independent interface path can be considered a separate system bus. It will be understood that in addition to the lines explicitly shown, a system bus can include strobe signaling lines, alert lines, auxiliary lines, and other signal lines.

It will be understood that the system bus includes a data bus (DQ 136) configured to operate at a bandwidth. Based on design and/or implementation of system 100, DQ 136 can have more or less bandwidth per memory device 140. For example, DQ 136 can support memory devices that have either a x32 interface, a x16 interface, a x8 interface, or other interface. The convention "xN," where N is a binary integer refers to an interface size of memory device 140, which represents a number of signal lines DQ 136 that exchange data with memory controller 120. The interface size of the memory devices is a controlling factor on how many memory devices can be used concurrently per channel in system 100 or coupled in parallel to the same signal lines. The term "coupled" can refer to elements that are physically, electrically, and/or communicatively connected either directly or indirectly, and may be used interchangeably with the term "connected" herein.

Memory devices 140 represent memory resources for system 100. Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory devices. In one embodiment, the memory device can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory. Descriptions herein referring to a "DRAM" can apply to any memory device that allows random access, whether volatile or nonvolatile. The memory device or DRAM can refer to the die itself and/or to a packaged memory product.

In one embodiment, each memory device 140 is a separate memory die, which can include multiple (e.g., 2) channels per die. Each memory device 140 includes I/O interface logic 142, which has a bandwidth determined by the implementation of the device (e.g., x16 or x8 or some other interface bandwidth). I/O interface logic 142 enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word.

In one embodiment, memory devices 140 are disposed directly on a motherboard or host system platform (e.g., a printed circuit board (PCB) on which processor 110 is disposed) of a computing device. In one embodiment, memory devices 140 can be organized into memory modules 130. In one embodiment, memory modules 130 represent dual inline memory modules (DIMMs). In one embodiment, memory modules 130 represent other organization of multiple memory devices to share at least a portion of access or control circuitry, which can be a separate circuit, a separate device, or a separate board from the host system platform. Memory modules 130 can include multiple memory devices 140, and the memory modules can include support for multiple separate channels to the included memory devices disposed on them.

Memory devices 140 each include memory resources 160. Memory resources 160 represent individual arrays of memory locations or storage locations for data. Typically, memory resources 160 are managed as rows of data, accessed via cacheline (rows) and bitline (individual bits within a row) control. Memory resources 160 can be organized as separate channels, ranks, and banks of memory. Channels are independent control paths to storage locations within memory devices 140. Ranks refer to common locations across multiple memory devices (e.g., same row addresses within different devices). Banks refer to arrays of memory locations within a memory device 140. In one embodiment, banks of memory are divided into sub-banks with at least a portion of shared circuitry for the sub-banks.

In one embodiment, memory devices 140 include one or more registers 144. Registers 144 represent storage devices or storage locations that provide configuration or settings for the operation of the memory device. In one embodiment, registers 144 can provide a storage location for memory device 140 to store data for access by memory controller 120 as part of a control or management operation. In one embodiment, registers 144 include Mode Registers. In one embodiment, registers 144 include multipurpose registers. The configuration of locations within register 144 can configure memory device 140 to operate in a different "mode," where command and/or address information or signal lines can trigger different operations within memory device 140 depending on the mode. Settings of register 144 can indicate configuration for I/O settings (e.g., timing, termination or ODT (on-die termination), driver configuration, and/or other I/O settings.

In one embodiment, memory device 140 includes ODT 146 as part of the interface hardware associated with I/O 142. ODT refers to connecting impedance between a power supply rail and the signal line at the receiver side. In one embodiment, the power supply rail is VDD or the high voltage supply. In one embodiment, a memory device can terminate from the signal line to VSS or ground or the low voltage supply. In one embodiment, a memory device can terminate the signal line to both VDD and VSS.

Memory device 140 includes controller 150, which represents control logic within the memory device to control internal operations within the memory device. For example, controller 150 decodes commands sent by memory controller 120 and generates internal operations to execute or satisfy the commands. Controller 150 can determine what mode is selected based on register 144, and configure the access and/or execution of operations for memory resources 160 based on the selected mode. Controller 150 generates control signals to control the routing of bits within memory device 140 to provide a proper interface for the selected mode and direct a command to the proper memory locations or addresses.

Referring again to memory controller 120, memory controller 120 includes command (CMD) logic 124, which represents logic or circuitry to generate commands to send to memory devices 140. Typically, the signaling in memory subsystems includes address information within or accompanying the command to indicate or select one or more memory locations where the memory devices should execute the command. In one embodiment, controller 150 includes command logic 152 to receive and decode command and address information received via I/O 142 from memory controller 120. Based on the received command and address information, controller 150 can control the timing of operations of the logic and circuitry within memory device 140 to execute the commands. According to one embodiment, controller 150 is responsible for compliance with standards or specifications.

In one embodiment, memory controller 120 includes refresh (REF) logic 126. Refresh logic 126 can be used where memory devices 140 are volatile and need to be refreshed to retain a deterministic state. In one embodiment, refresh logic 126 indicates a location for refresh, and a type of refresh to perform. Refresh logic 126 can trigger self-refresh within memory device 140, and/or execute external refreshes by sending refresh commands. External refreshes from the memory controller can include all bank refreshes and/or per bank refreshes. All bank refreshes cause the refreshing of a selected bank within all memory devices 140 coupled in parallel. Per bank refreshes cause the refreshing of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

According to one embodiment, the SOC 101 includes a multi-level memory management circuit 103 for remapping data between near and far memory. Different approaches to managing multi-level memories can have different benefits and drawbacks.

One way to manage multi-level memories is using memory partitioning. In one example of a system implementing memory partitioning, the operating system (OS) partitions the physical address space and maps program data to whichever memory regions happen to be available. In a system implementing memory partitioning, the OS can also opportunistically remap hot pages from far memory to near memory as usage patterns change. "Remapping" refers to either mapping or remapping, and involves creating a relationship between addresses. For example, if a page has been remapped from far memory to near memory, the data has been moved from far memory to near memory, and an access to the far memory address can be translated or redirected to the near memory address. A benefit of memory partitioning is the potential for leveraging existing memory management strategies by relying on the OS, which is often responsible for memory management. However, one drawback of memory partitioning is that it tends to respond slowly to changing locality characteristics. For example, when programs access a new page in memory, the page will typically be used intensely before moving to a new region. Thus, in one such approach, the OS may be unable to respond quickly enough to the new page accesses to take advantage of the performance benefits of near memory.

Another way to manage multi-level memories is to use hardware remapping. In one such example, hardware is responsible for remapping data between near and far memory without OS intervention. For example, hardware maintains remapping tables for memory in a manner similar to a cache. When a reference to a new page in far memory occurs, the hardware can immediately copy the data from far memory to near memory, which can enable capturing the bulk of the reuse. One downside of hardware remapping is the cost of the remapping structures, which can be significant. For example, the size of the remapping structures is tied to the size of the near memory, with one entry per page. In one example, in a memory with a 2 GB near memory organized into 4 KB pages, the remapping structures would have 512K entries. In this example, if 4 byte tags were used, 2 MB of storage would be used for the tags. Thus, the storage required for hardware remapping can be significant.

In contrast, in one embodiment, a multi-level memory management circuit can remap addresses between near and far memory without requiring significant remapping structures. Referring again to FIG. 1, in one embodiment, multi-level memory management circuit 103 is coupled with processor 110 and memory controller 120. According to one embodiment, remapping logic 105 detects requests for data from processor 110. After remapping logic 105 detects a request for data located in far memory, remapping logic 105 checks to see if the data has been remapped to near memory by looking for the far memory address in register array 107. Register array 107 is a "promoting register array." In one embodiment, promoting register array 107 includes entries to indicate which far memory addresses are mapped to the selected subset of near memory addresses. If remapping logic 105 determines that the far memory address of the requested data is in promoting register array 107, remapping logic 105 can determine the near memory address to which the requested data was copied. Remapping logic 105 can then send a request to memory controller 120 for the data at the near memory address to which the data was copied.

In one embodiment, if remapping logic 105 determines that the far memory address is not in promoting register array 107, and therefore not in near memory, remapping logic 105 moves the requested data to near memory. For example, remapping logic 105 can select an available near memory address from promoting register array 107, and initiate writing of the requested data to the selected near memory address. Thus, in one embodiment, remapping logic remaps physical addresses in far memory to physical addresses in near memory.

In the event that the requested data has not already been copied to near memory, in one embodiment, remapping logic 105 forwards the request to far memory. Remapping logic 105 can then copy the data from far memory to near memory and store the addresses in promoting register array 107. Remapping logic 105 can then redirect subsequent requests to the same far memory address to the near memory address to which the data was copied.

As is described in more detail below, if remapping logic 105 determines that there are no available entries in promoting register array 107, remapping logic 105 sends an interrupt to processor 110. An interrupt can also be referred to as a trap or exception, and is a signal emitted by hardware or software to the processor requesting attention in response to some event. A processor can respond to an interrupt by suspending its current activities, saving its state, and executing a function called an interrupt handler (which can also be referred to as an interrupt service routine (ISR)) to handle the event. Interrupts from hardware (referred to as hardware interrupts) can be implemented using electric signals that are sent to the processor from the hardware. Hardware interrupts are typically asynchronous and can occur in the middle of instruction execution. The act of initiating a hardware interrupt can be referred to as an interrupt request (IRQ). In some cases, an interrupt can be triggered by a special instruction in the instruction set which causes an interrupt when it is executed (e.g., a synchronous interrupt).

Figure 5A:
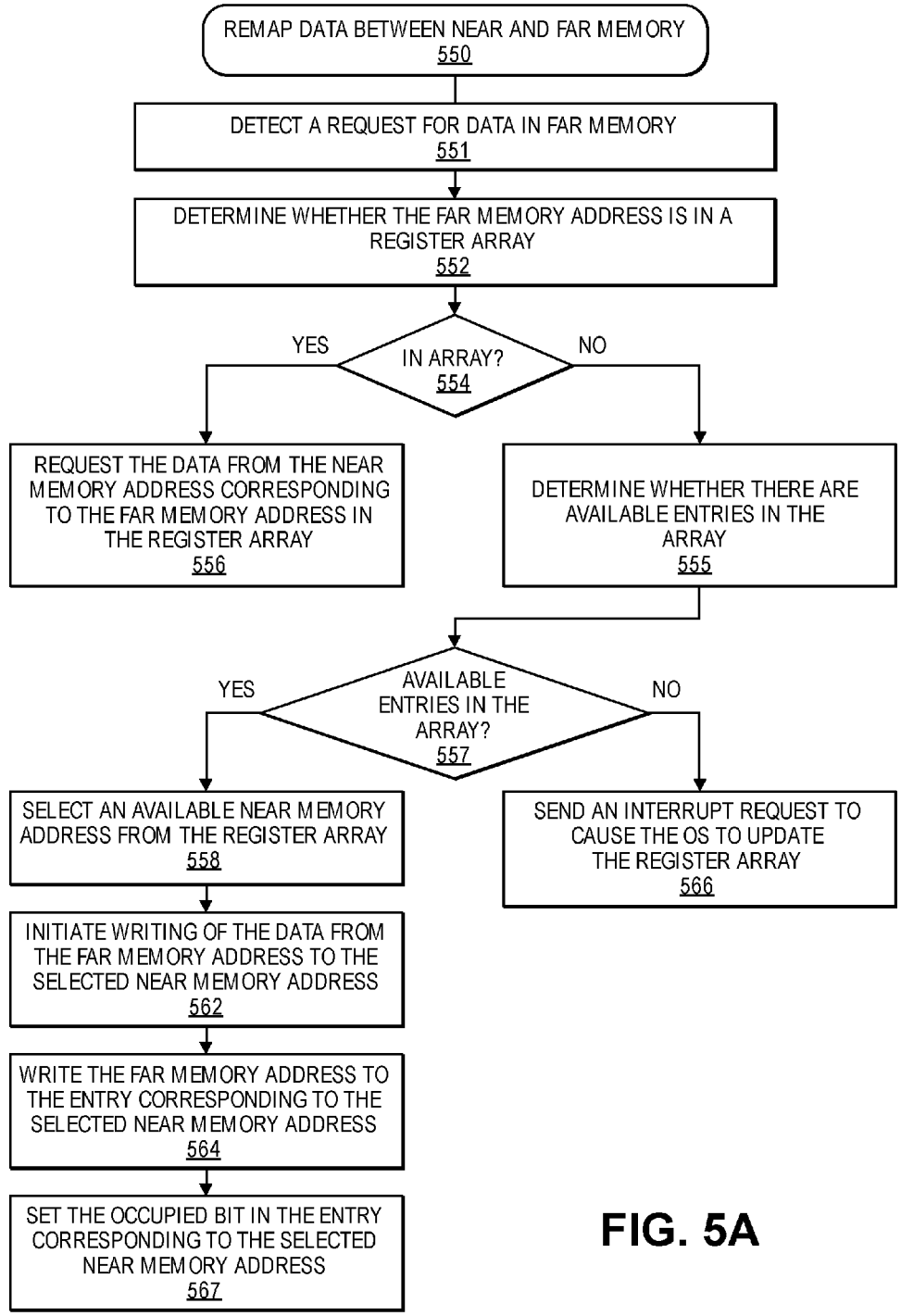
FIG. 5A is a flow diagram of an embodiment of a process of managing multi-level memory, including remapping data between near and far memory.
Figure 5B:
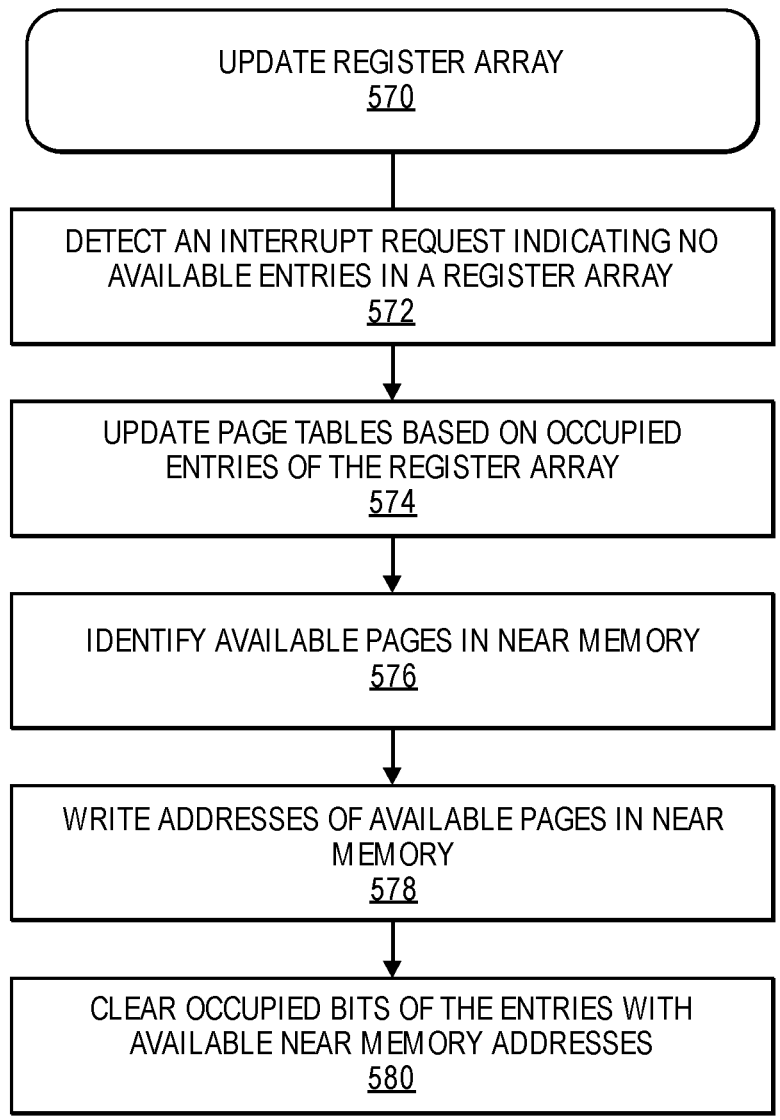
FIG. 5B is a flow diagram of an embodiment of a process for managing multi-level memory, including updating a register array with available near memory addresses.

In one embodiment, the interrupt causes the OS to execute interrupt handler code to update the register array with available near memory addresses. In order to update register array 107, the OS can select different near memory addresses that are available, or if no near memory addresses are available, the OS can select "victims" to demote to far memory. "Demoting" a page refers herein to copying the page from near memory to far memory or other storage. Demoting a page can make room in near memory for new pages. FIG. 5B and the corresponding description includes additional details on a method of updating a register array. In one embodiment, after selecting which data to copy from near memory to far memory, the OS can cause the data to be copied immediately, or the OS can store the intended writes to a "demoting" register array. Thus, one embodiment includes demoting register array 109 to stage the copying of data from near memory to far memory. Other embodiments do not include demoting register array 109, but instead can cause the data to be copied immediately (or at least without a substantial delay) after deciding to demote the data. Register arrays 107 and 109 can be implemented with any hardware structure capable of storing the relevant information described herein.

In one embodiment, delegation of the updating of promoting register array 107 to the OS enables the OS to choose which data should be placed in near memory and far memory. For example, the OS could pin certain critical memory regions in near memory by making those regions unavailable to multi-level memory management circuit 103. In one such example, the OS keeps track of regions that it has decided are unavailable, and does not write those near memory addresses to the register array for remapping. Delegation of updating of promoting register array 107 can also take advantage of high level application knowledge to help guide replacement decisions when selecting fresh victims from near memory. Additionally, allowing the OS to have some control over the mapping of memory can eliminate the requirement for a large tag structure. As mentioned above, in one embodiment, register array 107 stores information indicating which far memory addresses are mapped to a selected subset of near memory addresses. In one such embodiment, the number of entries in the register array can be independent of and less than the number of pages in near memory. Thus, in one embodiment, a multi-level memory management circuit can achieve performance gains associated with hardware remapping without requiring a tag array for every page in near memory. Furthermore, a multi-level memory management circuit can enable pages to be remapped as soon as they are referenced rather than waiting for the OS to remap them.

Additionally, in contrast to other approaches which would incur the costs associated with interrupt handling every time a page is moved, the costs can be incurred once for a greater number of pages. For example, the costs associated with interrupt handling and page table modifications can be incurred once for as many pages are remapped by register array 107, thus amortizing the costs over multiple pages. Therefore, embodiments can minimize the fixed costs associated with an OS interrupt. Furthermore, in one embodiment, by including remapping logic to immediately cause a page to be moved to near memory, a multi-level memory management circuit can take advantage of the short bursty usage patterns that can occur in real workloads. Thus, in one embodiment, a multi-level management circuit can allow for the bulk transfer of pages from far memory to near memory to be under hardware control, but also allow the OS to manage the mapping of memory at a coarser granularity.

In one embodiment, the SOC 101 includes a direct memory access (DMA) engine 111 to access memory resources 160 to transfer data between near and far memory. In one embodiment, DMA engine 111 can access memory resources 160 relatively independently from processor 110 in the sense that processor 110 initiates a DMA transfer, and then is able to perform other operations while DMA engine 111 performs the transfer. In one embodiment, processor 110 initiates a DMA transfer based on the entries of demoting register array 109. In one such embodiment, DMA engine 111 reads the entries of demoting register array 109 and copies the pages from the near memory addresses indicated in demoting register array 109 to the corresponding far memory addresses. Thus, in one embodiment, freeing space in near memory can be handled in the background by DMA engine 111. When the DMA transfer is complete, DMA engine 111 can send an interrupt to processor 110 indicating that the transfer is complete. Although FIG. 1 depicts demoting register array 109, other embodiments can take advantage of DMA transfers without a dedicated demoting register array, but instead with generic DMA registers, for example. In other embodiments, the OS and/or remapping logic 105 can use demoting register array 109 to keep track of data to transfer without requiring DMA engine 111. For example, the OS can store addresses of pages to be demoted from near memory in demoting register array 109. The OS and/or remapping logic 105 can then generate commands to transfer data based on the entries of demoting register 109.

Thus, a multi-level memory management circuit as described herein can preserve the low cost and simplicity of an OS managed approach while capturing performance benefits of a hardware approach.

Figure 2:
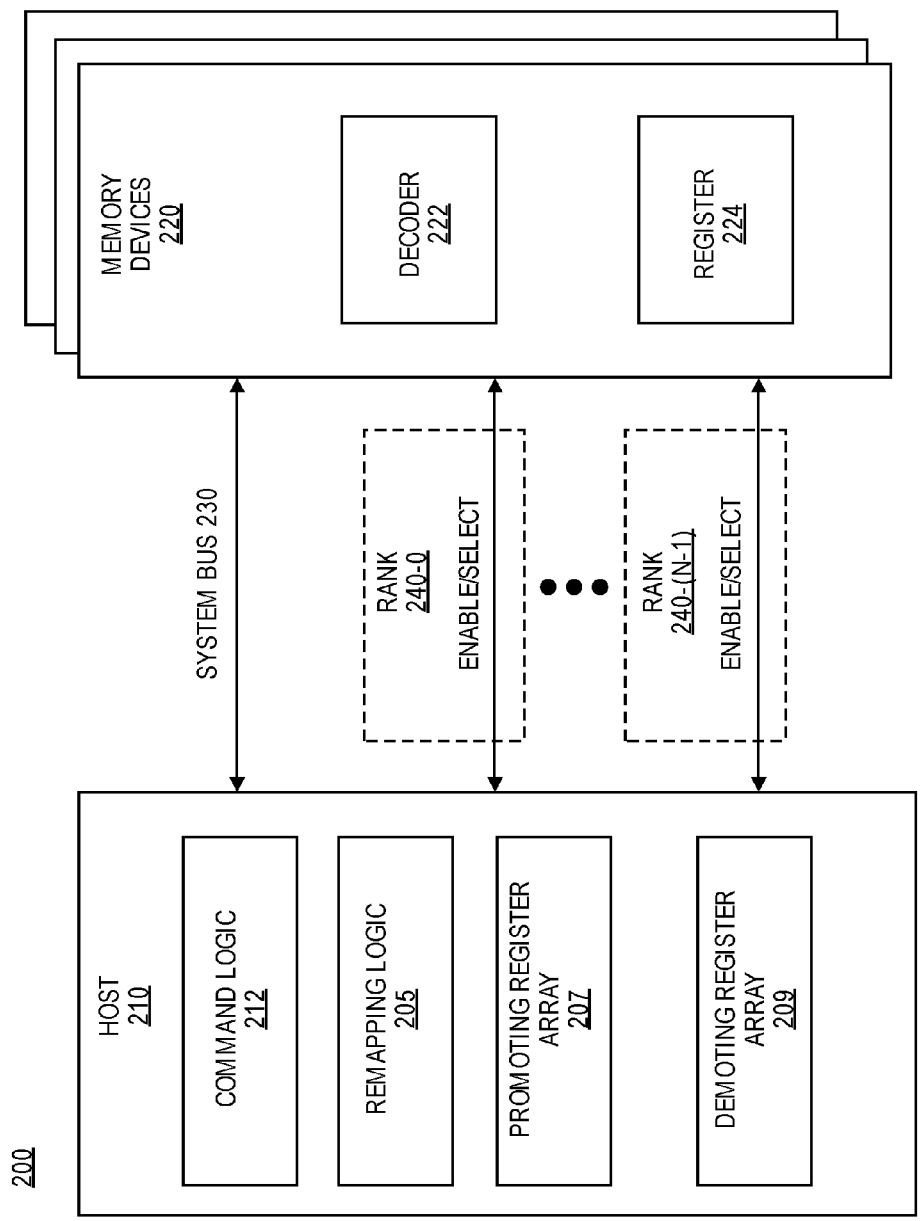
FIG. 2 is a block diagram of an embodiment of a system that includes a multi-level memory management circuit.

FIG. 2 is a block diagram of an embodiment of a system that includes a multi-level memory management circuit. System 200 illustrates portions of a memory subsystem of a computing device, and provides one example of an embodiment of system 100 of FIG. 1. Host 210 represents logic that will manage accesses to system memory. Host 210 can include a memory controller or other circuit on a processor or SOC or integrated with a processor to control memory access.

Memory devices 220 represent multiple devices that store code and/or data for a host system to execute operations. Memory devices 220 can be organized as ranks 240 to facilitate access to larger numbers of bits concurrently. A rank includes multiple memory devices in parallel. In one embodiment, ranks 240 share data pins, command/address (C/A) pins, and clock pins. Each rank 240 includes a specific one or more enable signals to select between different ranks. As illustrated, system 200 includes N ranks 240. The specific grouping of the signal lines is not necessarily physically grouped by rank. In one embodiment, certain signal lines are reused between ranks 240. In one embodiment, all memory devices 220 share the same system bus 230, such as data bus and command/address (C/A) bus, and share a clock or strobe signal (which can include one or more signal lines). System 200 can use enable signals, such as CKE (clock enable) and chip select (CS), and/or CS and other enable signals, to distinguish one rank or device grouping from another. Thus, memory devices 220 that are part of the same rank 240 can share the same enable/select signal. In an implementation involving an I/O interface between something other than a memory subsystem, rank 240 can represent some other grouping of devices by common bus.

Host 210 includes command logic 212 to generate commands to memory devices 220. In one embodiment, command logic 212 is coupled with multi-level memory management circuit 211. Multi-level memory management circuit 211 remaps data between near and far memory, in accordance with an embodiment. As depicted in FIG. 2, multi-level memory management circuit 211 includes remapping logic 205, a promoting register array 207, and a demoting register array 209. Multi-level memory management circuit 211 can be the same, or similar to, the multi-level memory management circuit 103 described above in FIG. 1. For example, remapping logic 205 can detect requests for data in memory devices 220, and if the requests are to addresses in far memory, determine whether or not those addresses are in promoting register array 207. If the far memory addresses are in promoting register array 207, remapping logic 205 can modify the address of the request to be the corresponding near memory address to which the requested data was copied. Multi-level memory management circuit 211 can also include a demoting register array 209 to assist in transferring data to far memory (or other storage) to clear up space in near memory.

Memory devices 220 include decoder 222, which represents logic to receive and decode commands from host 210. The decoding can determine whether the command applies to the memory device. In one embodiment, memory device 220 includes register 224 to set one or more configuration parameters. Settings of register 224 can indicate configuration for I/O settings (e.g., timing, termination or ODT (on-die termination), driver configuration, and/or other I/O settings.

Figure 3:
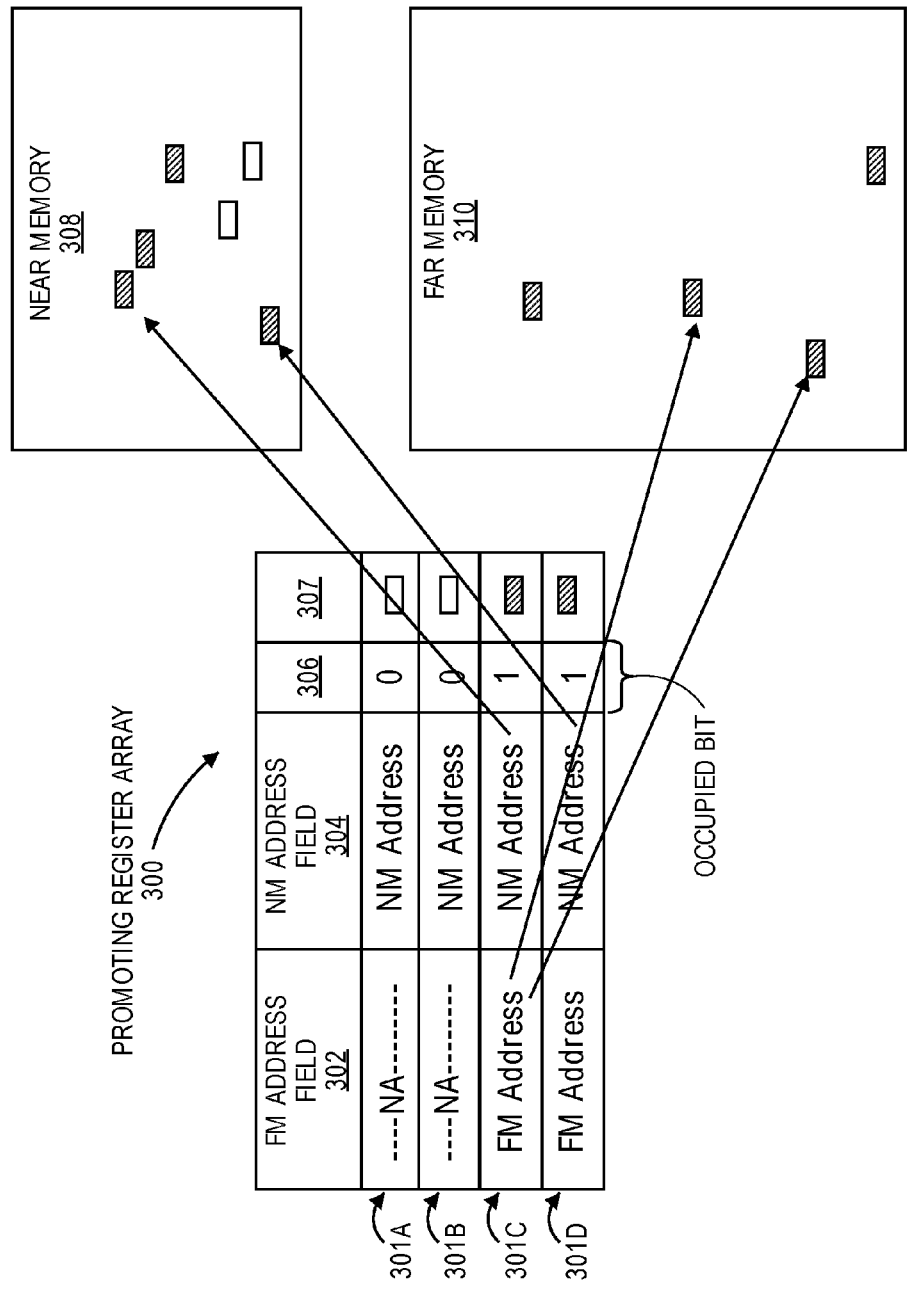
FIG. 3 is a representation of a register array to store near memory addresses and far memory addresses that are mapped to the near memory addresses, in accordance with an embodiment.

FIG. 3 is a representation of a register array to store near memory addresses, in accordance with an embodiment. The register array 300 of FIG. 3 is an example of a promoting register array such as promoting register array 107 of FIG. 1 discussed above. In one embodiment, promoting register array 300 includes information to indicate which addresses in far memory 310 have been mapped to a subset of addresses in near memory 308. As illustrated, near memory 308 is smaller than far memory 310, although in other embodiments near memory 308 can be larger than or equal in size to far memory 310.

In one embodiment, promoting register array 300 includes far memory address field 302 to store an address in far memory. Promoting register array 300 also includes near memory address field 304. Near memory address field 304 is to store an address in near memory. Far memory address field 302 and near memory address field 304 could also be referred to as storing pointers to data in far and near memory, respectively. Promoting register array 300 includes a number of entries that store mappings of far memory addresses to a subset of near memory addresses. A subset of near memory addresses includes less than all the near memory addresses, and could range from 1 to the number of near memory addresses minus one. For example, in one embodiment a register array includes 256 entries to store addresses for 256 pages in near memory, wherein near memory includes more than 256 total pages. Other embodiments can include 512, 1024, or another integer number of entries to hold a subset of near memory addresses. The number of entries can be selected based on desired performance and/or hardware considerations. For example, a smaller number of entries can result in a less expensive implementation, but may have reduced performance due to increased frequency of OS interrupts. In another example, a larger number of entries can improve performance, but can increase cost. In one embodiment, whether a larger or smaller number of entries is employed, the number of entries in promoting register array 300 is less than the number of pages in near memory 308. Thus, in one such embodiment, promoting register array 300 does not have an entry corresponding to every page in near memory 308. Such an approach can enable performance increases without requiring a prohibitively large tag structure.

As illustrated, promoting register array 300 also includes occupied bit 306. An "occupied bit" is at least one bit indicating whether or not the corresponding near memory address is available for remapping. Thus, the "occupied bit" could also be referred to as an "available bit" to denote the opposite status. Although the term "bit" is used, each entry of the register array can have more than a single bit to denote whether or not a given near memory address is available and/or to convey other status information about the entry. As discussed above, in one embodiment, remapping logic (e.g., remapping logic 105 of FIG. 1) is to select an available near memory address based on the value of occupied bit 306. For illustrative purposes, FIG. 3 also includes a visual representation 307 of whether the corresponding near memory address is available or occupied.

In one embodiment, entries of promoting register array 300 are accessible via physical memory addresses. Therefore, in one such embodiment, the processor (e.g., processor 110 of FIG. 1) can access promoting register array 300 with read and write commands to physical memory addresses. The ability to access the entries of promoting register array 300 via physical memory addresses can enable the OS to read and modify entries of promoting register array 300 during interrupt handling to update promoting register array 300. In the example illustrated in FIG. 3, promoting register array 300 includes four near memory addresses in entries 301A-301D. Promoting register array 300 is depicted in a state of operation in which the array 300 is partially full. For example, two entries 301A, 301B are available and two entries 301C, 301D are occupied, as indicated by the value of occupied bit 306 and the corresponding visual representation 307. In one embodiment, register array 300 executes an embodiment of a method in accordance with what is illustrated in FIG. 5A.

Figure 4:
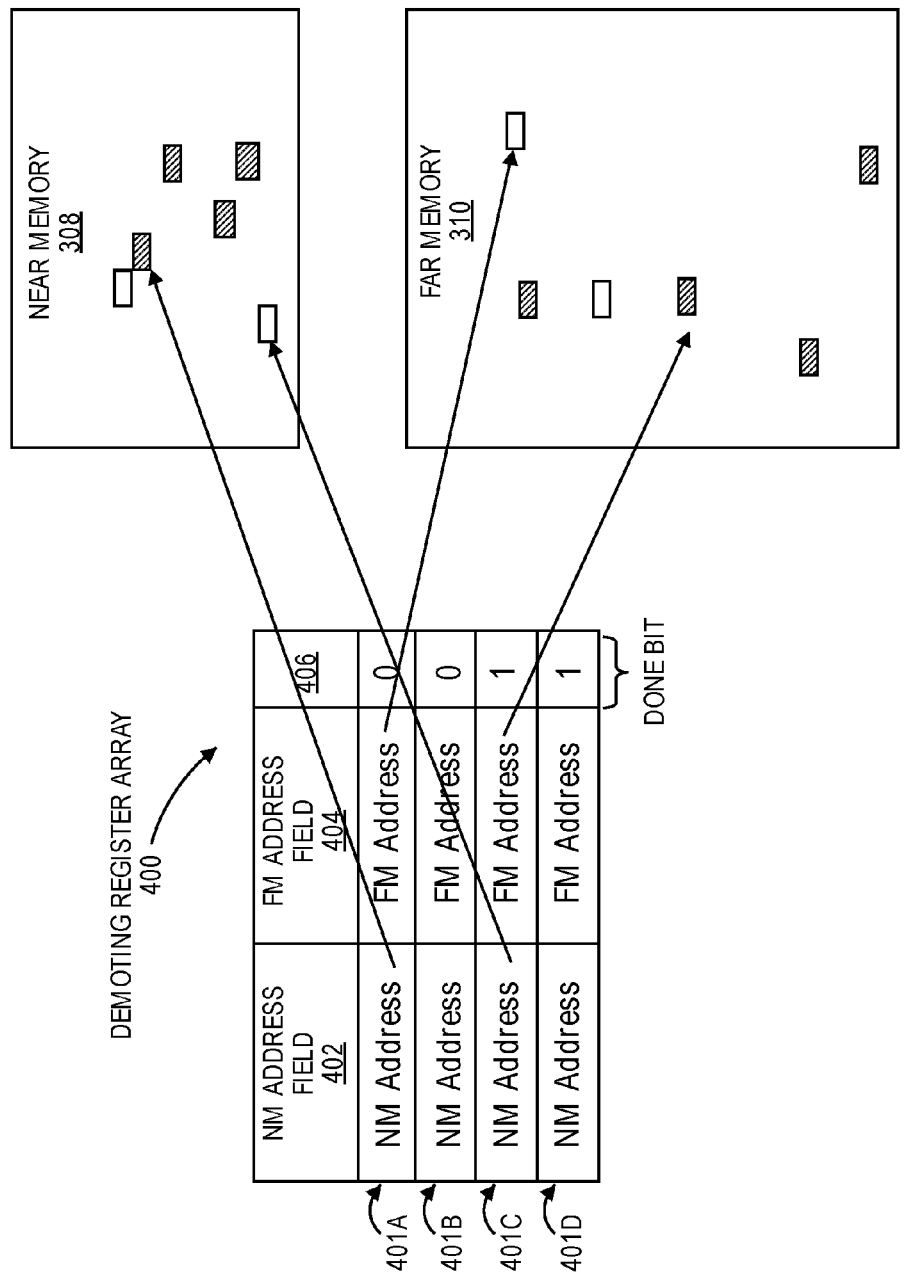
FIG. 4 is a representation of a register array for staging data writes from near memory to far memory, in accordance with an embodiment.

FIG. 4 is a representation of a register array for staging data writes from near memory to far memory, in accordance with an embodiment. As discussed above, in one embodiment, remapping logic triggers an interrupt when the promoting register array is full. In response, the OS is to update the promoting register array with new available near memory addresses. In the event that there are no available near memory addresses, the OS can select pages in near memory to move to far memory, and accordingly free up near memory addresses for the promoting register array. In one embodiment, the system can employ a demoting register array to assist with the transfer of data from near memory to far memory.

The register array 400 of FIG. 4 is an example of a demoting register array. The demoting register array 400 is an example of an embodiment of demoting register array 109 of FIG. 1 discussed above. In one embodiment, demoting register array 400 includes near memory address field 402 and far memory address field 404. In one embodiment, near memory address field 402 is to hold an address in near memory 308 from which data is to be copied. Far memory address field 404 is to hold an address in far memory 310 to which the data is to be copied. Thus, in one embodiment, entries 401A-401D of demoting register array 400 indicates which pages are to be copied from near memory, and the locations in far memory to which the pages are to be copied.

In one embodiment, in response to an interrupt request, a DMA engine, such as DMA engine 111 of FIG. 1, is to write the data pointed to by near memory address field 402 to the far memory address stored in far memory address field 404. In other embodiments, the OS and/or remapping logic can transfer the data by using regular read and write commands to memory instead of employing a DMA engine. In one embodiment, demoting register array 400 includes a done bit 406. A "done bit" is at least one bit to indicate whether the data pointed to by the corresponding near memory address field has been copied. Thus, the "done bit" could also be referred to as a "not done bit" to denote the opposite status. Although the term "bit" is used, each entry of demoting register array 400 can have more than a single bit to denote whether or not the corresponding memory transfer has completed and/or to convey other status information about the entry. Similar to FIG. 3, in one embodiment, the entries of demoting register array 400 can be made accessible via physical memory addresses. For example, demoting register array 400 can be assigned physical memory addresses and therefore be accessible via memory read and write commands. FIG. 4 will be discussed in further detail below in light of the method illustrated in FIG. 5A.

FIG. 5A is a flow diagram of an embodiment of a process of managing multi-level memory, including remapping data between near and far memory. As described above, a multi-level memory management circuit can include a register array to store near memory addresses and far memory addresses that are mapped to the near memory addresses. The multi-level memory management circuit can also include remapping logic to remap addresses in response to requests for data in far memory. Remapping logic can perform remapping as soon as it detects requests to far memory, and can therefore take advantage of bursty usage patterns to improve system performance without requiring prohibitively large tag arrays. Examples of a multi-level memory management circuit are included in FIG. 1 (multi-level memory management circuit 103) and FIG. 2 (multi-level memory management circuit 211). An example of a register array is included in FIG. 3 (promoting register array 300).

The operations of process 550 can be performed by a multi-level memory management circuit. In one embodiment, remapping logic detects a request for data in far memory, 551. For example, a processor (e.g., processor 110 of FIG. 1) can request a page located in far memory, and the remapping logic can detect or receive the request. In response to the request, remapping logic can determine whether the far memory address of the requested data is in a register array, 552. For example, referring to FIG. 3, remapping logic can check the far memory address field 302 of each of the entries 301A-301D to see if the entries 301A-301D include the far memory address of the requested data. If the far memory address is in the register array, 554 YES branch, the remapping logic requests the data from the near memory address corresponding to the far memory address in the register array, 556. For example, referring again to FIG. 3, if the far memory address in entry 301C matches the far memory address of the requested data (i.e., if there is a "hit"), the remapping logic can reroute the request to the corresponding near memory address stored in the near memory address field 304 of entry 301C.

If the far memory address is not in the register array, 554 NO branch, the remapping logic determines whether there are available near memory addresses in the array, 555. For example, referring to FIG. 3, if remapping logic checks the occupied entries 301C, 301D of the register array 300 and determines that the far memory addresses stored in the far memory address fields 302 of the entries 301C, 301D do not match the far memory address of the requested data (i.e., if there is not a "hit"), the remapping logic can proceed to look for an available near memory address. In one embodiment, determining whether there are available near memory addresses involves determining whether there are entries with cleared occupied bits. In the example illustrated in FIG. 3, remapping logic would determine that there are available near memory addresses by reading the occupied bit 306 of entries 301A, 301B, in accordance with an embodiment. However, if there are no available near memory addresses in the register array, 557 NO branch, the remapping logic sends an interrupt request to cause the OS (or another logic or processor-executed instructions) to update the register array with available entries, 566.

Returning again to the scenario where there are available near memory addresses in the array, 557 YES branch, the remapping logic selects an available near memory address from the register array, 558. In one embodiment in which entries of the register array include an occupied bit, selecting the available near memory address is based on the value of the corresponding occupied bit. For example, remapping logic selects an entry with an occupied bit equal to '0' indicating that the entry is available. In the example illustrated in FIG. 3, the remapping logic can select entry 301A or entry 301B.

In one embodiment, after selecting the near memory address, remapping logic initiates a write of the data from the far memory address to the selected near memory address, 562. Initiating the write of data from far memory can include generating a read command to the far memory address to read the data, and generating a write command to the near memory address to write the data. In another embodiment, the remapping logic triggers the writing of the data via a DMA engine.

In one embodiment, remapping logic writes the far memory address in the entry of the register array corresponding to the selected near memory address, 564. For example, referring to FIG. 3, if entry 301A is selected, remapping logic can store the far memory address in far memory address field 302 of entry 301A.

In one embodiment, remapping logic modifies the corresponding occupied bit to indicate the selected near memory address is unavailable, 567. In an embodiment where the occupied bit indicates unavailability, the bit could be set to '1,' for example, to indicate that the near memory address is unavailable. However, in another embodiment in which the register array includes an "available bit" instead of an "occupied bit," remapping logic can clear the available bit to '0' to indicate availability. As mentioned above, other embodiments can employ a field with more than one bit to indicate status. Thus, remapping logic can respond to detected accesses to far memory by copying the data from far memory to near memory, and updating a register array to keep track of the remapping until to OS can update the page tables.

As mentioned above, as pages from far memory are copied to near memory, all of the near memory addresses in the register array will be consumed, in accordance with embodiments. The OS can then update the register array with available near memory addresses. FIG. 5B is a flow diagram of an embodiment of a process for updating a register array with available near memory addresses. In one embodiment, the operations of process 570 are performed by an OS (e.g., via an interrupt handler), firmware, a driver, or other system software. Although the following description sometimes refers specifically to an OS, other embodiments could employ other system software to perform the described operations. In one such embodiment, process 570 begins when remapping logic sends an interrupt request in response to determining that the register array is full. For example, referring to FIG. 5A, remapping logic sends an interrupt request to the processor to trigger the OS to update the register array with available entries, 566. Referring again to FIG. 5B, the OS detects the interrupt request indicating that there are no available entries in the register array, 572. In one embodiment, in response to the interrupt request, the OS updates page tables based on the occupied entries of the register array, 574.

A page table is data structure used to map the physical addresses of pages to virtual addresses. Memory can be organized as pages, which are blocks of memory referenced by an entry in a page table. In one such embodiment, the OS is responsible for defining the mappings by managing the page tables. Some embodiments also include a translation lookaside buffer (TLB) to translate virtual page addresses to physical page addresses. A TLB is a specialized cache used for virtual address translation. When a request to a virtual address is received, hardware can first try to translate the address to a physical address using the TLB. If the virtual address is not in the TLB, the page tables can be used to translate the address. Thus, in one embodiment, when remapping logic (such as remapping logic 105 of FIG. 1) causes a page to be moved from one physical address to another physical address, the system updates the TLB and the page tables to map a given virtual address to the new physical address. In one such embodiment, the OS is responsible for updating the page tables. Hardware mechanisms (e.g., a memory controller or other memory management hardware) can update the TLB as the system operates and encounters TLB misses. Accordingly, in one such embodiment, remapping logic provides an additional layer of mapping that is separate from virtual to physical address mapping. When the remapping logic determines that the promoting register array is full, the remapping logic can trigger an interrupt to cause the OS to update the page tables.

In one embodiment, the OS updates the page tables by replacing the far memory addresses in a page table with the near memory addresses to which the far memory addresses were mapped based on the information in the register array. Similarly, if the multi-level management circuit or OS caused pages to be moved from near memory to far memory, the OS can replace the near memory addresses in the page table with the far memory addresses.

Once the OS updates the page tables, the OS can populate the register array with addresses of new unallocated pages. To populate the register array, the OS identifies available pages in near memory, 576. Identifying available pages can involve identifying unallocated or otherwise available pages. In one embodiment, the OS maintains a record of a "remapping region," which is a list of unallocated pages in near memory. In one such embodiment, selecting available pages in near memory involves selecting pages from the list maintained by the OS. Identifying available pages can also (or alternatively) involve making pages available. For example, if there are no unallocated pages remaining, the OS can make pages available by moving pages out of near memory (e.g., to far memory or other storage). In one such embodiment, the OS can select pages for demoting to far memory to make new pages available.

In one embodiment where the OS selects pages from near memory for demotion, the OS copies the data located at the near memory address to far memory. In one embodiment, the OS or hardware (e.g., remapping logic) initiates copying of data located at the address of the selected near memory page to an address in the far memory. Copying the data can be performed by software or hardware, and can be performed immediately upon selection of the pages in near memory, or can be queued for later. For example, in one embodiment, the OS can keep records of which pages are to be transferred from near memory to far memory. Such records can be kept in a register array such as demoting register array 400 of FIG. 4. For example, referring to FIG. 4, the OS can write the address of a page in near memory that has been selected for demotion to far memory to near memory address field 402 of a given entry. The OS can further write the address of an available far memory address to far memory address field 404 corresponding to the page in near memory to be demoted. The OS or remapping logic can then trigger a DMA engine to copy the data from the near memory addresses indicated in the demoting register array to the corresponding far memory addresses.

In one embodiment, the OS writes the addresses of the available pages in near memory to register array, 578. The newly selected available pages can have different addresses than the previous subset of near memory addresses in the register array. Thus, in one such embodiment, the OS can be said to update the register array with a different or new subset of available near memory addresses. In one embodiment, the OS modifies the occupied bits corresponding to the available near memory addresses to indicate availability, 580.

Therefore, in one embodiment, upon detecting an interrupt request, the OS can update the register array with available near memory addresses, which can enable remapping logic to continue remapping data between near and far memory.

Figure 6:
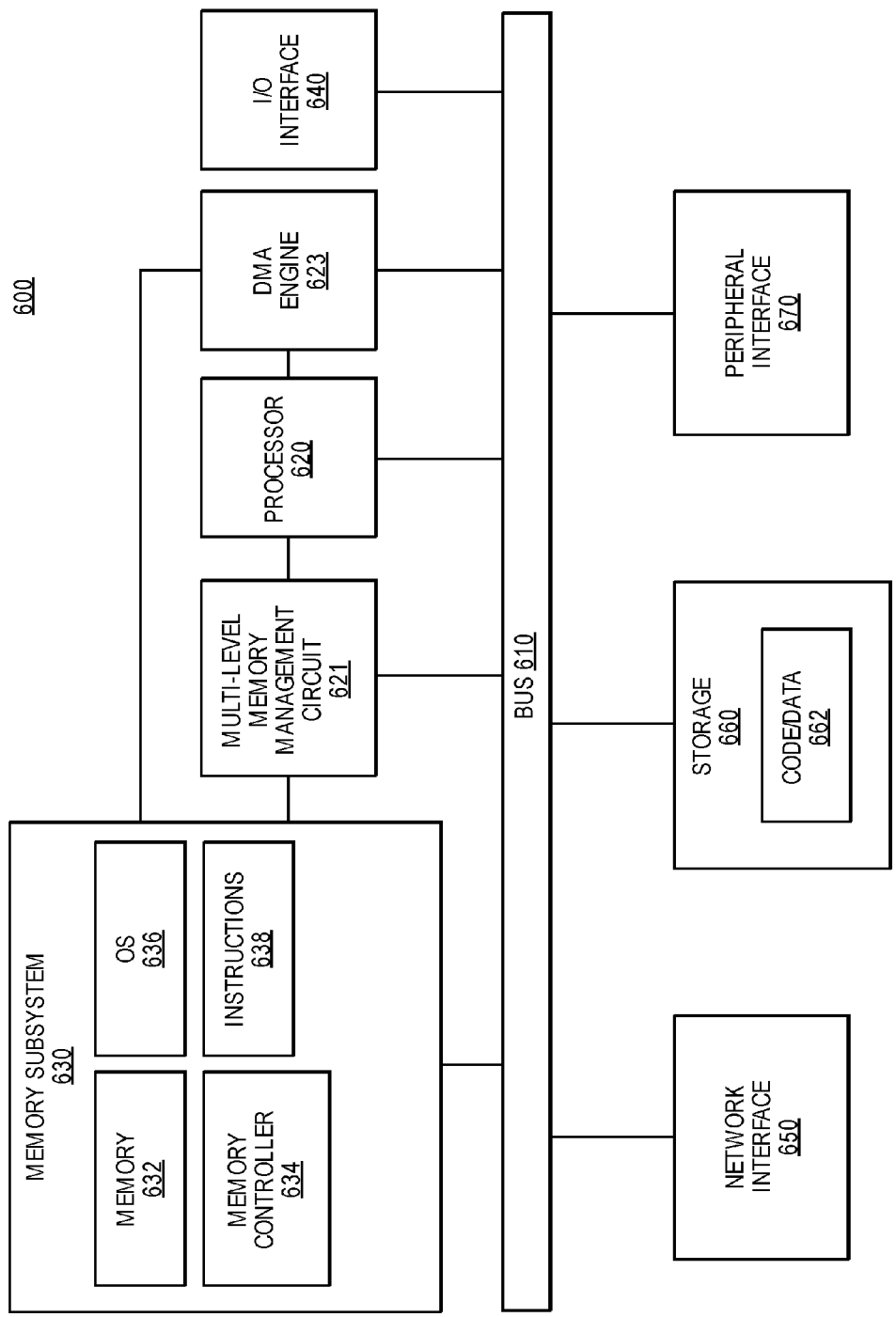
FIG. 6 is a block diagram of an embodiment of a computing system in which a multi-level memory management circuit can be implemented.

FIG. 6 is a block diagram of an embodiment of a computing system in which multi-level memory management can be implemented. System 600 represents a computing device in accordance with any embodiment described herein, and can be a laptop computer, a desktop computer, a server, a gaming or entertainment control system, a scanner, copier, printer, routing or switching device, or other electronic device. System 600 includes processor 620, which provides processing, operation management, and execution of instructions for system 600. Processor 620 can include any type of microprocessor, central processing unit (CPU), processing core, or other processing hardware to provide processing for system 600. Processor 620 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 can include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620. Memory subsystem 630 includes memory device 632 where it stores data, instructions, programs, or other items. In one embodiment, memory subsystem includes memory controller 634, which is a memory controller to generate and issue commands to memory device 632. It will be understood that memory controller 634 could be a physical part of processor 620.

In one embodiment, system 600 further includes multi-level memory management circuit 621 coupled with processor 620 and memory subsystem 630. Multi-level memory management circuit 621 can perform remapping between near and far memory according to any of the embodiments described herein. For example, multi-level memory management circuit 621 can be the same, or similar to, multi-level memory management circuit 103 of FIG. 1.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 can also correspond to interfaces in network interface 650.

System 600 also includes one or more input/output (I/O) interface(s) 640, network interface 650, one or more internal mass storage device(s) 660, and peripheral interface 670 coupled to bus 610. I/O interface 640 can include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 can include an Ethernet adapter, wireless interconnection components, USB (universal serial bus), or other wired or wireless standards-based or proprietary interfaces.

Direct memory access (DMA) engine 623 includes logic and/or registers for performing transfers of data between different locations in memory 632 and/or between memory 632 and storage 660. According to one embodiment, processor 620 initiates a DMA transfer, and then is able to perform other operations while DMA engine 623 performs the transfer.

Storage 660 can be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 can be generically considered to be a "memory," although memory 630 is the executing or operating memory to provide instructions to processor 620. Whereas storage 660 is nonvolatile, memory 630 can include volatile memory (i.e., the value or state of the data is indeterminate if power is interrupted to system 600).

Peripheral interface 670 can include any hardware interface not specifically mentioned above. Peripherals refer generally to devices that connect dependently to system 600. A dependent connection is one where system 600 provides the software and/or hardware platform on which operation executes, and with which a user interacts.

Figure 7:
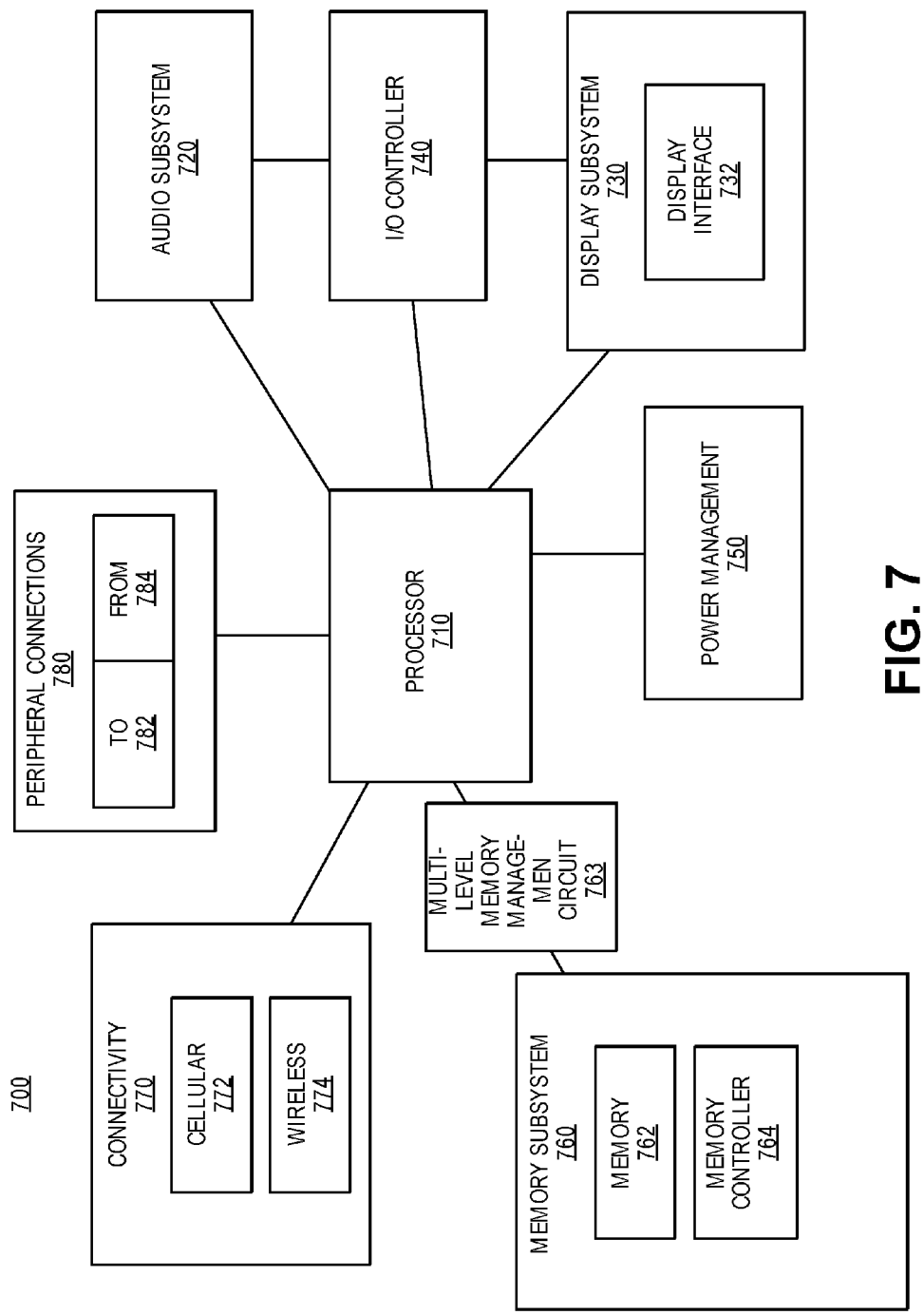
FIG. 7 is a block diagram of an embodiment of a mobile device in which a multi-level memory management circuit can be implemented.

FIG. 7 is a block diagram of an embodiment of a mobile device in which a multi-level memory management circuit can be implemented. Device 700 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user. In one embodiment, display subsystem 730 includes a high definition (HD) display that provides an output to a user. High definition can refer to a display having a pixel density of approximately 100 pixels per inch (PPI) or greater, and can include formats such as full HD (e.g., 1080p), retina displays, 4K (ultra high definition or UHD), or others.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device(s) 762 for storing information in device 700. Memory subsystem 760 can include nonvolatile (state does not change if power to the memory device is interrupted) and/or volatile (state is indeterminate if power to the memory device is interrupted) memory devices. Memory devices 762 can store application data, user data, music, photos, documents, or other data, as well as system data (whether long-term or temporary) related to the execution of the applications and functions of device 700. In one embodiment, memory subsystem 760 includes memory controller 764 (which could also be considered part of the control of device 700, and could potentially be considered part of processor 710). Memory controller 764 includes a scheduler to generate and issue commands to memory device 762. In one embodiment, device 700 further includes multi-level memory management circuit 763 coupled with processor 710 and memory subsystem 760. Multi-level memory management circuit 763 can perform remapping between near and far memory according to any of the embodiments described herein. For example, multi-level memory management circuit 763 can be the same, or similar to, multi-level memory management circuit 103 of FIG. 1.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Device 700 can be powered by a battery, wireless charging, a renewal energy source (e.g., solar power), or when connected to a wall outlet.

In one embodiment, a multi-level memory management circuit includes a register array to store near memory addresses of a near memory and far memory addresses mapped to the near memory addresses. The number of entries in the register array is less than the number of pages in the near memory. The multi-level memory management circuit includes remapping logic to detect a request for data located in far memory. The remapping logic is to further determine that a far memory address of the requested data is absent from the register array and select an available near memory address from the register array. The remapping logic is to further initiate a write of the data from the far memory address to the selected near memory address. The remapping logic is to further write the far memory address to an entry of the register array corresponding to the selected near memory address.

In one embodiment, a given entry of the register array includes an occupied bit, and the remapping logic is to select the available near memory address based on a value of a corresponding occupied bit.

In one embodiment, in response to selection of the available near memory address, the remapping logic is to further modify the corresponding occupied bit to indicate the selected near memory address is unavailable.

In one embodiment, the remapping logic is to, in response to a determination that no near memory addresses in the register array are available, trigger an interrupt request to update the register array with available near memory addresses.

In one embodiment, the updated register array is to include a different subset of available near memory addresses.

In one embodiment, the multi-level memory management circuit further includes a second register array to store near memory addresses selected for demotion to available far memory addresses. In response to the interrupt request, a direct memory access (DMA) engine is to write pages pointed to by the near memory addresses selected for demotion to the available far memory addresses stored in the second register array.

In one embodiment, entries of the register array are accessible via physical memory addresses.

In one embodiment, in response to a determination that the far memory address of the request is in the register array, the remapping logic is to request the data located at a corresponding near memory address.

In one embodiment, a system to couple with memory devices includes a processor to request data located in far memory and a register array to store near memory addresses of a near memory and far memory addresses mapped to the near memory addresses. The number of entries in the register array is less than a number of pages in the near memory. The system also include remapping logic coupled with the processor. The remapping logic is to determine that a far memory address of the requested data is absent from the register array and select an available near memory address from the register array. The remapping logic is to initiate a write of the requested data at the far memory address to the selected near memory address, and write the far memory address to an entry of the register array corresponding to the selected near memory address.

In one embodiment, a given entry of the register array includes an occupied bit, and the remapping logic is to select the available near memory address based on a value of a corresponding occupied bit.

In one embodiment, in response to selection of the available near memory address, the remapping logic is to further modify the corresponding occupied bit to indicate the selected near memory address is unavailable.

In one embodiment, in response to a determination that no near memory addresses in the register array are available, the remapping logic is to further send an interrupt request to the processor to update the register array with available near memory addresses. In one embodiment, the updated register array is to include a different subset of available near memory addresses.

In one embodiment, the system further includes a second register array to store near memory addresses selected for demotion to available far memory addresses. In response to the interrupt request, a direct memory access (DMA) engine is to write pages pointed to by the near memory addresses selected for demotion to the available far memory addresses stored in the second register array.

In one embodiment, the entries of the register array are accessible via physical memory addresses.

In one embodiment, in response to a determination that the far memory address of the request is in the register array, the remapping logic is to request the data located at a corresponding near memory address.

In one embodiment, the system further includes any of a display communicatively coupled to the processor, a network interface communicatively coupled to the processor, or a battery coupled to provide power to the system.

In one embodiment, a method of managing a system with multi-level memory involves detecting a request for data in a far memory. The method further involves determining whether a far memory address of the requested data is in a register array. The register array is to store near memory addresses of a near memory and far memory addresses mapped to the near memory addresses. A number of entries in the register array is less than a number of pages in the near memory. The method further involves selecting an available near memory address from the register array, and initiating a write of the data from the far memory address to the selected near memory address. The method also involves writing the far memory address to an entry of the register array corresponding to the selected near memory address.

In one embodiment, a given entry of the register array includes an occupied bit, and selecting the available near memory address is based on a value of a corresponding occupied bit.

In one embodiment, the method further involves, in response to selection of the available near memory address, modifying the corresponding occupied bit to indicate the selected near memory address is unavailable.

In one embodiment, the method further involves, in response to a determination that no near memory addresses in the register array are available, triggering an interrupt request to update the register array with available near memory addresses.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A multi-level memory management circuit comprising:
a register array to store near memory addresses of a near memory and far memory addresses mapped to the near memory addresses, wherein a number of entries in the register array is less than a number of pages in the near memory; and
remapping logic to:
  detect a request for data located in far memory;
  determine that a far memory address of the requested data is absent from the register array;
  select an available near memory address from the register array;
  initiate a write of the data from the far memory address to the selected near memory address; and
  write the far memory address to an entry of the register array corresponding to the selected near memory address.

2. The multi-level memory management circuit of claim 1, wherein:
a given entry of the register array includes an occupied bit; and
wherein the remapping logic is to select the available near memory address based on a value of a corresponding occupied bit.

3. The multi-level memory management circuit of claim 2, wherein:
in response to selection of the available near memory address, the remapping logic is to further modify the corresponding occupied bit to indicate the selected near memory address is unavailable.

4. The multi-level memory management circuit of claim 2, wherein the remapping logic is to further:
in response to a determination that no near memory addresses in the register array are available, trigger an interrupt request to update the register array with available near memory addresses.

5. The multi-level memory management circuit of claim 4, wherein:
the updated register array is to include a different subset of available near memory addresses.

6. The multi-level memory management circuit of claim 4, further comprising:
a second register array to store near memory addresses selected for demotion to available far memory addresses; and
wherein, in response to the interrupt request, a direct memory access (DMA) engine is to write pages pointed to by the near memory addresses selected for demotion to the available far memory addresses stored in the second register array.

7. The multi-level memory management circuit of claim 1, wherein entries of the register array are accessible via physical memory addresses.

8. The multi-level memory management circuit of claim 1, wherein in response to a determination that the far memory address of the request is in the register array, the remapping logic is to request the data located at a corresponding near memory address.

9. A system to couple with memory devices, the system comprising:
a processor to request data located in far memory;
a register array to store near memory addresses of a near memory and far memory addresses mapped to the near memory addresses, wherein a number of entries in the register array is less than a number of pages in the near memory;
remapping logic coupled with the processor, the remapping logic to:
  determine that a far memory address of the requested data is absent from the register array;
  select an available near memory address from the register array;
  initiate a write of the requested data at the far memory address to the selected near memory address; and
  write the far memory address to an entry of the register array corresponding to the selected near memory address.

10. The system of claim 9, wherein:
a given entry of the register array includes an occupied bit; and
the remapping logic is to select the available near memory address based on a value of a corresponding occupied bit.

11. The system of claim 10, wherein in response to selection of the available near memory address:
the remapping logic is to further modify the corresponding occupied bit to indicate the selected near memory address is unavailable.

12. The system of claim 11, wherein:
in response to a determination that no near memory addresses in the register array are available, the remapping logic is to further send an interrupt request to the processor to update the register array with available near memory addresses.

13. The system of claim 12, wherein:
the updated register array is to include a different subset of available near memory addresses.

14. The system of claim 12, further comprising:
a second register array to store near memory addresses selected for demotion to available far memory addresses; and
wherein, in response to the interrupt request, a direct memory access (DMA) engine is to write pages pointed to by the near memory addresses selected for demotion to the available far memory addresses stored in the second register array.

15. The system of claim 9, wherein entries of the register array are accessible via physical memory addresses.

16. The system of claim 9, wherein in response to a determination that the far memory address of the request is in the register array, the remapping logic is to request the data located at a corresponding near memory address.

17. The system of claim 9, further comprising any of: a display communicatively coupled to the processor; a network interface communicatively coupled to the processor; or a battery coupled to provide power to the system.

18. A method of managing a system with multi-level memory, the method comprising:
detecting a request for data in a far memory;
determining whether a far memory address of the requested data is in a register array, wherein the register array is to store near memory addresses of a near memory and far memory addresses mapped to the near memory addresses, wherein a number of entries in the register array is less than a number of pages in the near memory;

selecting an available near memory address from the register array;

initiating a write of the data from the far memory address to the selected near memory address; and writing the far memory address to an entry of the register array corresponding to the selected near memory address.

19. The method of claim 18, wherein:

a given entry of the register array includes an occupied bit; and wherein selecting the available near memory address is based on a value of a corresponding occupied bit.

20. The method of claim 19, further comprising: in response to selection of the available near memory address, modifying the corresponding occupied bit to indicate the selected near memory address is unavailable.

21. The method of claim 19, further comprising:

in response to a determination that no near memory addresses in the register array are available, triggering an interrupt request to update the register array with available near memory addresses.

* * * * *